United States Patent
Huard

(10) Patent No.: US 6,552,523 B2
(45) Date of Patent: Apr. 22, 2003

(54) COMBINATION LOW CAPACITANCE PROBE TIP AND SOCKET FOR A MEASUREMENT PROBE

(75) Inventor: Richard J. Huard, Beaverton, OR (US)

(73) Assignee: Tektronix, Inc., Beaverton, OR (US)

(*) Notice: Subject to any disclaimer, the term of this patent is extended or adjusted under 35 U.S.C. 154(b) by 0 days.

(21) Appl. No.: 09/866,348

(22) Filed: May 24, 2001

(65) Prior Publication Data

US 2002/0175667 A1 Nov. 28, 2002

(51) Int. Cl.[7] .................. G01R 1/06; G01R 31/02
(52) U.S. Cl. .................. 324/72.5; 324/149; 324/754
(58) Field of Search ............... 324/72.5, 149, 324/754, 761, 755, 133, 121 R

(56) References Cited

U.S. PATENT DOCUMENTS 6,218,826 B1 * 4/2001 Nightingale ............... 324/149
6,384,615 B2 * 5/2002 Schwindt ................... 324/754

* cited by examiner

Primary Examiner—N. Le
Assistant Examiner—James C. Kerveros
(74) Attorney, Agent, or Firm—William K. Bucher

(57) ABSTRACT

A low capacitance probe tip and socket for a measurement probe has a probe tip extending through an insulating plug and a recess defining a socket formed in the plug. The socket has an aperture formed therein that provides access the low capacitance probe tip. An electrically conductive contact is disposed in the aperture that extends into the socket and is in electrical contact with the low capacitance probe tip. In one embodiment, the socket is formed parallel to the low capacitance probe tip. In a further embodiment, the socket is formed at an angle to the low capacitance probe tip with the electrically conductive contact being an electrically conductive elastomeric material disposed at the distal end of the socket in electrical contact with the low capacitance probe tip.

17 Claims, 3 Drawing Sheets

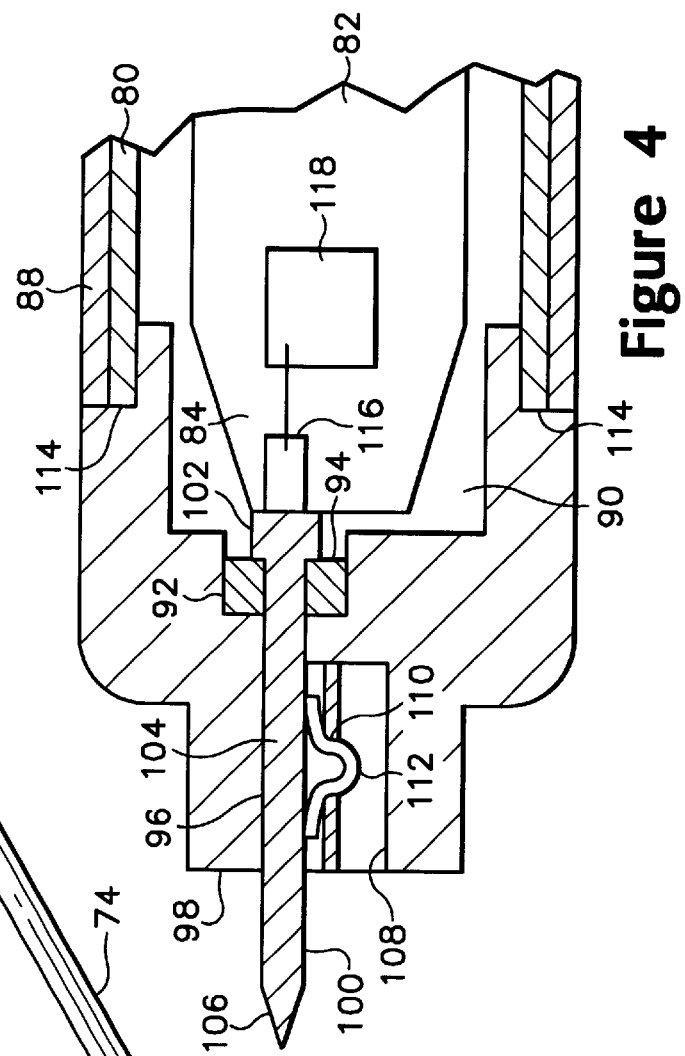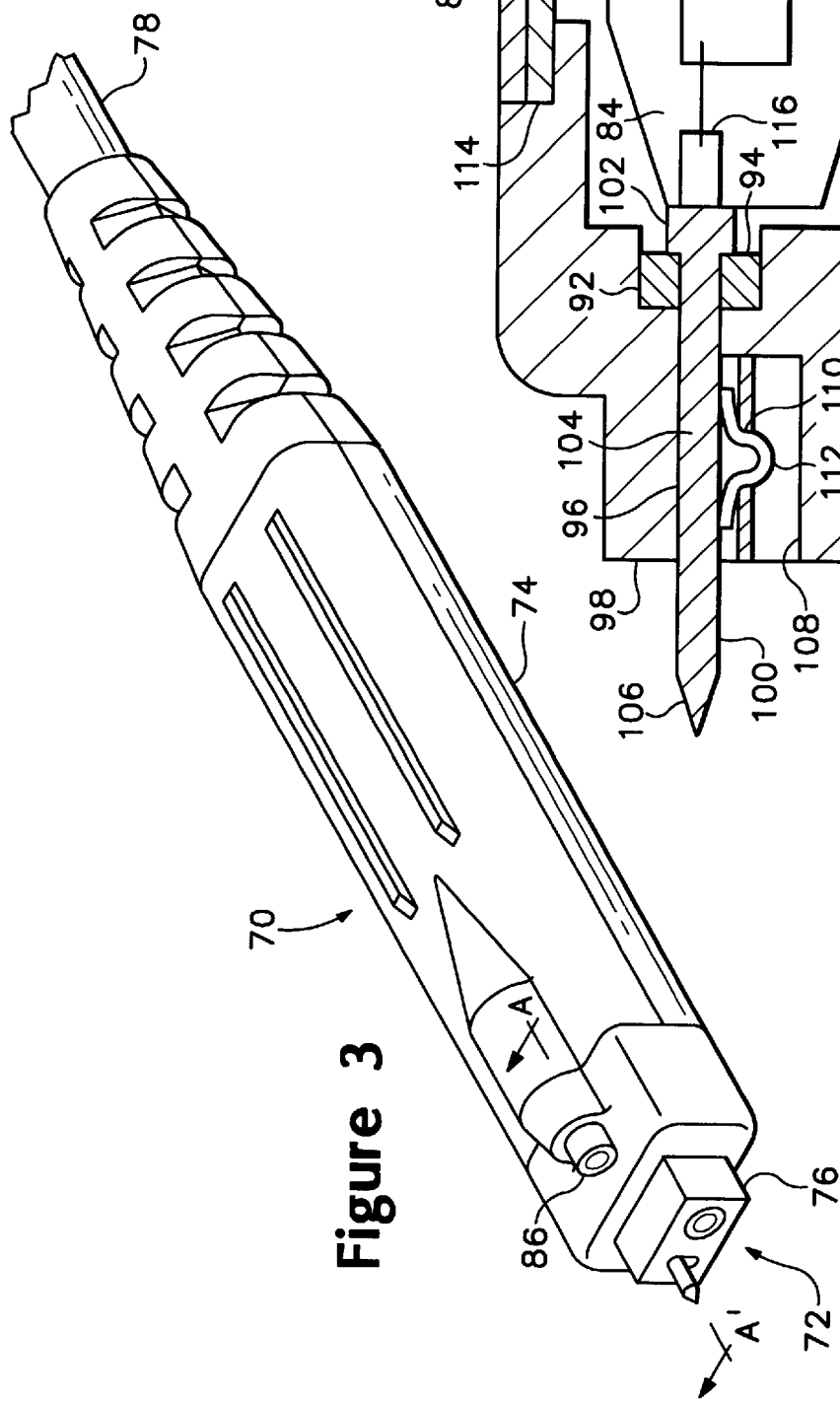

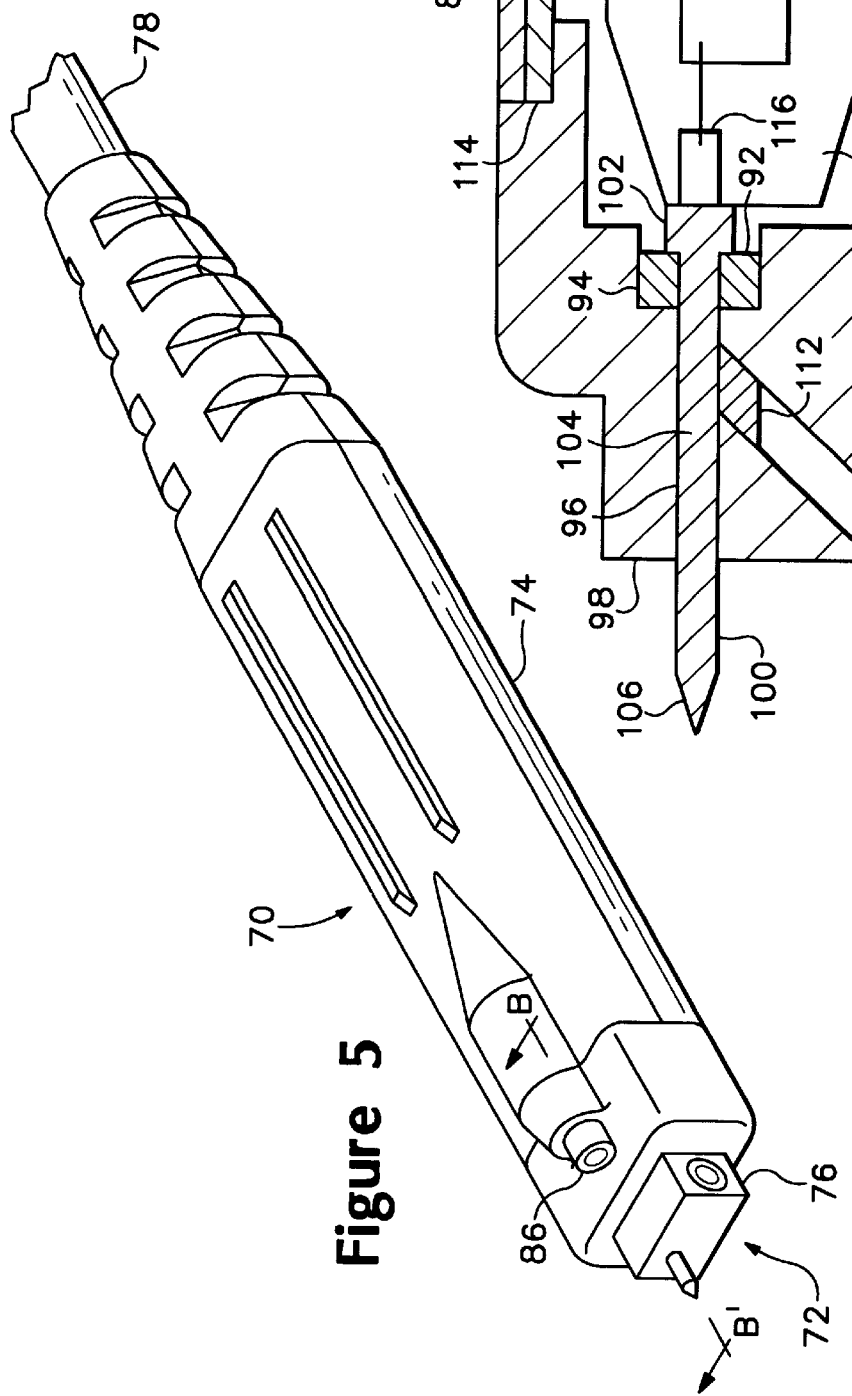

COMBINATION LOW CAPACITANCE PROBE TIP AND SOCKET FOR A MEASUREMENT PROBE

BACKGROUND OF THE INVENTION

The present invention relates generally to measurement probes and more particularly to a combination low capacitance probe tip and socket for a measurement probe.

Voltage measurement probes couple an electrical signal from a device under test to a measurement test instrument, such as an oscilloscope and the like. Measurement probes include a probe head, a transmission line, such as a coaxial cable, and a connector housing having a signal connector, such as a BNC, SMA, BMA connector or the like, that connects to a mating signal connector on the measurement instrument. The probe head generally includes a metal tube or housing in which is disposed a substrate. A probing tip or socket is disposed in a holder that is inserted into one end of the probe head. The probe tip or socket extends from the holder and is electrically coupled to the substrate. The substrate has passive or active circuitry formed thereon that provides high impedance to the circuit generating the signal under test. The substrate circuitry is electrically coupled to the transmission line. The other end of the transmission line is electrically coupled to the signal connector.

High frequency measurement probes, such as those for probing signals in the 3 GHz to 4 GHz range, require high input impedance values and low input capacitances. Generally, these types of probes have an active transistor input stage for low circuit loading and have a frequency bandwidth up to 4 GHZ or more. An example of such a probe is the P6217 Active FET Probe, manufactured and sold by Tektronix, Inc., Beaverton, Oreg. and assignee of the instant application.

FIG. 1 is a side-sectional view of the P6217 probe 10 showing the internal configuration of the probe elements. The probe 10 has an electrically conductive circular tubular housing 12 in which is disposed a substrate 14. The substrate is slightly off center in the tubular housing so that the upper surface of the substrate is centered in the housing. The end of the substrate 14 extends slightly outward from the end of the tubular housing and is tapered to provide clearance for a probe tip holder 16. Passive and active electrical components 18, such as bipolar transistors, resistors, capacitors and the like are mounted on the substrate. A gold foil contact 20 extends over the front end of the substrate 14 for providing an electrical connection between the substrate 14 and a probing tip 22. The probe tip holder 16 is made of insulating material, such as plastic or the like, and is secured within the end of the housing 12. The holder 16 has a cavity 24 with a tapered end 26 that receives a portion of the substrate 14 extending out past the end of the housing 12. The tapered end 26 is centrally formed in the holder 16 and has a bore 28 extending therefrom to the front end of the holder 16. The probing tip 22 has a head 30 and a shank 32 that is disposed in the holder 16 with the head 30 positioned in the tapered end 26 and the shank 32 extending through the bore 28 with the tip of the shank 32 exposed at the front end of the holder 16. A resilient elastomeric member 34 is disposed in the tapered end 26 between the probing tip head 30 and the holder to provide a compressive force between the head 30 and the gold foil contact 20 on the end of the substrate 14. An insulating boot 36 is positioned over a substantial portion of the tubular housing 12 to electrically insulate the housing 12 from the user.

Referring to FIG. 2, there is shown a side-section view of another type of probe 40 having active circuitry. In this particular probe design, a socket 42 is provided in the probe tip holder 44. An example of such a probe is the P6245 Active probe, manufactured and sold by Tektronix, Inc., Beaverton, Oreg. The socket type active probe has a frequency bandwidth up to 1.5 GHz. The probe has a rectangular cross-section electrically conductive housing 46. A substrate 48 having active and passive circuitry 49 mounted thereon is mounted on a carrier 50 that is inserted into the housing 46. A gold foil contact 52 extends over the front end of the substrate 48 for providing an electrical connection between the substrate 48 and the socket 42. The probe tip holder 44 has a bore 54 there through in which is positioned the electrically conductive socket 42. An electrically conductive elastomeric material 56 is positioned between the socket 42 and the edge of the substrate 48 to electrically connect the socket to the circuit board and to provide a compressive force. A second socket 58 is positioned and electrically coupled to the housing 46 to provide a ground connection. An insulating boot 60 is positioned over a substantial portion of the housing 46 to electrically insulate the housing from the user. The socket 42 is designed to allow placement on square pin connectors mounted on a circuit board under test. Also, various types of probe tip adapters are provided with the probe for different types of probing operations. For example, a pointed tip may be inserted into the socket for placing the probe on circuit board traces, IC leads and the like.

A drawback to the socket style tip is that the metal socket diameter is much larger than the needle tip, so the socket is closer to the probe's metal tubular housing, increasing capacitance. The increased capacitance at the probe tip results in lower frequency bandwidth. Adding the various probe tip adapters further increases the tip capacitance. Likewise, adding a socket tip adapter to the probing tip of the higher frequency probe reduces the overall frequency bandwidth. What is needed is a measurement probe that allows both probing using a probing tip and a socket type connection, without the higher capacitance of a socket type connection.

SUMMARY OF THE INVENTION

Accordingly, the present invention is to a low capacitance probe tip and socket for a measurement probe having an insulating plug disposed in one end of a probe head. The insulating plug has a bore there through for receiving a low capacitance probe tip and a recess defining a socket. The socket has an aperture formed therein that provides access to the low capacitance probe tip. An electrically conductive contact is disposed in the aperture that extends into the socket and is in electrical contact with the low capacitance probe tip. In one embodiment, the socket is formed parallel to the low capacitance probe tip. The electrically conductive contact is then a spring contact formed on the probe tip and extends through the aperture into the socket. The spring contact is an electrically conductive beryllium-copper wire affixed to the probe tip and has a fold therein that extends through the aperture into the socket. In a further embodiment, the socket is formed at an angle to the low capacitance probe tip. The electrically conductive contact is then an electrically conductive elastomeric material disposed at the distal end of the socket in electrical contact with the low capacitance probe tip.

A measurement probe has a probe head that includes the low capacitance probe tip and socket. The probe head has a substrate disposed therein with probe circuitry formed on the substrate and an insulating plug disposed in one end of the probe head having a bore there through for receiving a low capacitance probe tip that is electrically coupled to the substrate. The insulating plug has a recess defining a socket with the socket having an aperture formed therein to access the low capacitance probe tip. An electrically conductive contact is disposed in the aperture that extends into the socket and is in electrical contact with the low capacitance probe tip. In one embodiment, the socket is formed parallel to the probe tip and in a further embodiment the socket is formed at an angle to the low capacitance probe tip. In the first embodiment, the electrically conductive element is a spring contact formed on the probe tip and extends through the aperture into the socket. The spring contact is an electrically conductive beryllium-copper wire affixed to the probe tip and has a fold therein that extends through the aperture into the socket. In the further embodiment, the electrically conductive contact is an electrically conductive elastomeric material disposed at the distal end of the socket in electrical contact with the low capacitance probe tip.

The objects, advantages and novel features of the present invention are apparent from the following detailed description when read in conjunction with the attached drawings.

BRIEF DESCRIPTION OF THE DRAWINGS

FIG. 3 is a perspective view of the combination probe tip and socket usable in a measurement probe according to the present invention.

FIG. 4 is a sectional view along line A-A' of the combination probe tip and socket usable in a measurement probe according to the present invention.

FIG. 5 is a perspective view of a further embodiment of the combination probe tip and socket usable in a measurement probe according to the present invention.

FIG. 6 is a sectional view along line B-B' of the further embodiment of the combination probe tip and socket usable in a measurement probe according to the present invention.

DETAILED DESCRIPTION OF THE PREFERRED EMBODIMENT

Figure 1:
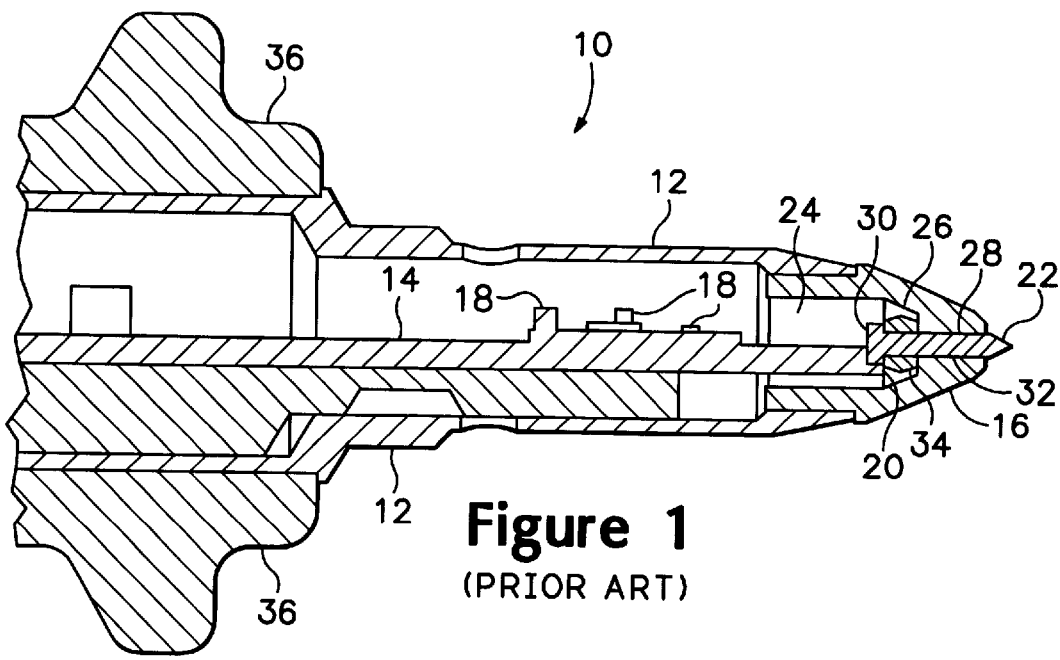
FIG. 1 is a side-sectional view of a measurement probe having a pointed probing tip extending from the probe head.
Figure 2:
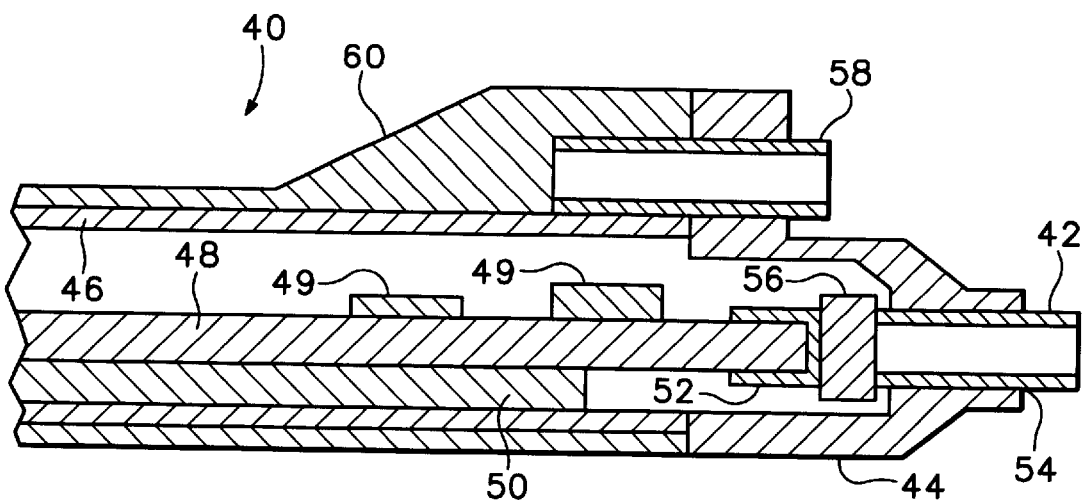
FIG. 2 is a side-sectional view of a measurement probe having a socket tip extending from the probe head.

Referring to FIG. 3, there is shown a perspective view of a measurement probe 70 having a combination low capacitance probe tip and socket 72. The measurement probe 70 has a probe head 74 into which is inserted an insulating plug 76. A transmission line 78, such as a coaxial cable or the like extends from the other end of the probe head 74. The probe head 74 has an electrically conductive tubular housing 80 into which is disposed a substrate 82 as shown in the sectional view along line A-A' in FIG. 4. The tubular housing 80 may be circular, rectangular, oval or the like in cross-section. The substrate 82 has a tapered end 84 that extends past the end of the housing 80. A socket 86 is positioned and electrically coupled to the housing 80 to provide a ground connection. An insulating boot 88 is positioned over a substantial portion of the tubular housing 80 to electrically insulate the housing 80 from the user.

The end of the insulating plug 76 inserted into the probe head 74 has a cavity 90 that receives the tapered end 84 of the substrate 82 extending out past the end of the housing 80. The plug 76 is preferably formed of plastic or similar type of moldable or shapable insulating material. The cavity 90 has a recess 92 formed therein that receives an elastomeric material 94. A bore 96 extends from the recess 92 in the cavity 90 to the front surface 98 of the plug 76. A low capacitance probe tip 100 having a head 102 and a shank 104 is disposed in the bore 96 in the plug with the head 102 abutting the elastomeric material 94 and the shank 104 extending through the bore 96 such that the tip of the shank 106 is exposed at the front end of the plug 76. The plug further has a recess 108 defining a socket that is adjacent to and parallel with the bore 96. The socket 108 has an aperture 110 formed therein that accesses the shank 104 of the probe tip 100. An electrically conductive contact 112 is mounted on the shank 104 such that the contact is disposed in the aperture 110 with a portion of the contact 112 extending into the socket 108. The contact 112 may be formed from beryllium-copper wire that is secured to the shank 104 by conventional securing means, such as welding, brazing or the like. A fold is formed in the wire to produce the contact 112 which may be heat treated. The probe tip 100 and the electrically conductive contact 112 are preferably plated with a layer of gold over a plated under-layer of nickel.

The insulating plug 76 with the combination low capacitance probe tip and socket 72 is inserted into the tubular housing 80. Shoulders 114 formed on the plug 76 seat against the end of the tubular housing 80. The head 102 of the probe tip 100 abuts against a gold foil contact 116 mounted over the end of the substrate 82 with the elastomeric material 94 providing force against the head 102 to assure electrical contact between the head 102 and the gold foil contact 116. The gold foil contact 116 is typically coupled to a passive circuit in series with a high impedance input of an integrated circuit 118 that is mounted on the substrate 82.

Referring to FIGS. 5 and 6, there are shown respective perspective and sectional views of a further embodiment of the combination low capacitance probe tip and socket 72 usable in a measurement probe 70. Like elements from FIGS. 3 and 4 are labeled the same in FIGS. 5 and 6. Structurally, the two embodiments are the same with the exception of the configuration of the recess in the insulating plug 76. In the further embodiment, the recess 108 defining the socket in the plug 76 is at an angle to the bore 96 that receives the probe tip 100. The distal end of the socket 108 intersects the shank 104 of the probe tip 100. The electrically conductive contact 112 is formed of an electrically conductive elastomeric material that is placed at the distal end of the socket 108 in electrical contact with the shank 104.

The measurement probe 70 with the combination low capacitance probe tip and socket 72 is useable for probing specific points of a device under test, such as circuit runs, integrated circuit leads, circuit pads and the like, using the probe tip 100, as well as engaging square pin connectors, such as 0.018 and 0.025 square pin connectors, mounted on the device under test using the socket 108. In the first embodiment where the socket 108 is parallel to the probe tip 100, the square pin connector is inserted into the socket 108 with the connector sliding past and depressing the electrically conductive contact 112 to make the electrical connection between the square pin connector and the probe tip 100. In the other embodiment, the square pin connector is inserted into the socket 108 with the connector contacting and depressing the electrically conductive elastomeric material to make the electrical connection between the square pin connector and the probe tip.

A combination low capacitance probe tip and socket has been described for a measurement probe where the probe tip and socket combination has an insulating plug disposed in one end of a probe head. The insulating plug has a bore there through for receiving a low capacitance probe tip and a recess that defines a socket. The socket has an aperture formed therein that provides access to the low capacitance probe tip. An electrically conductive contact is disposed in the aperture that extends into the socket and is in electrical contact with the low capacitance probe tip. The socket may be formed parallel to the low capacitance probe tip or at an angle to the probe tip. The electrically conductive contact may be formed as a spring contact on the probe tip that extends through an aperture into the socket. The spring contact may be an electrically conductive beryllium-copper wire affixed to the probe tip with a fold therein that extends through the aperture into the socket. The electrically conductive contact may also be an electrically conductive elastomeric material that is positioned in an aperture at the distal end of the socket in electrical contact with the low capacitance probe tip.

It will be obvious to those having skill in the art that many changes may be made to the details of the above-described embodiments of this invention without departing from the underlying principles thereof. The scope of the present invention should, therefore, be determined only by the following claims.

What is claimed is:

1. A low capacitance probe tip and socket for a measurement probe comprising:
    an insulating plug disposed in one end of a probe head having a bore there through for receiving a low capacitance probe tip;
    the insulating plug having a recess defining a socket with the socket having an aperture formed therein to access the low capacitance probe tip;
    an electrically conductive contact disposed in the aperture in electrical contact with the low capacitance probe tip and extending into the socket.

2. The low capacitance probe tip and socket as recited in claim 1 wherein the socket is formed parallel to the low capacitance probe tip.

3. The low capacitance probe tip and socket as recited in claim 2 wherein the electrically conductive contact further comprises a spring contact formed on the probe tip and extending through the aperture into the socket.

4. The low capacitance probe tip and socket as recited in claim 3 wherein the spring contact further comprises an electrically conductive wire affixed to the probe tip and having a fold therein that extends through the aperture into the socket.

5. The low capacitance probe tip and socket as recited in claim 4 wherein the electrically conductive wire is formed of beryllium-copper.

6. The low capacitance probe tip and socket as recited in claim 3 wherein the electrically conductive wire is formed of beryllium-copper.

7. The low capacitance probe tip and socket as recited in claim 1 wherein the socket is formed at an angle to the low capacitance probe tip.

8. The low capacitance probe tip and socket as recited in claim 7 wherein the distal end of the socket intersects the low capacitance probe tip and the electrically conductive contact further comprises an electrically conductive elastomeric material disposed at the distal end of the socket in electrical contact with the low capacitance probe tip.

9. A low capacitance probe tip and socket for a measurement probe wherein the measurement probe has a probe head with a substrate having probe circuitry formed thereon disposed therein comprising:
    an insulating plug disposed in one end of the probe head having a bore there through for receiving a low capacitance probe tip with the probe tip being electrically coupled to the substrate;
    the insulating plug having a recess defining a socket formed therein that parallel to the low capacitance probe tip with the socket having an aperture formed therein to access the low capacitance probe tip;
    an electrically conductive spring contact formed on the probe tip and extending through the aperture into the socket.

10. A low capacitance probe tip and socket for a measurement probe wherein the measurement probe has a probe head with a substrate having probe circuitry formed thereon disposed therein comprising:
    an insulating plug disposed in one end of the probe head having a bore there through for receiving a low capacitance probe tip with the probe tip being electrically coupled to the substrate;
    the insulating plug having a recess defining a socket wherein the socket is formed at an angle to the low capacitance probe tip with the distal end of the socket intersecting the low capacitance probe tip;
    an electrically conductive elastomeric material disposed at the distal end of the socket in electrical contact with the low capacitance probe tip.

11. A measurement probe having a low capacitance probe tip and socket comprising:
    a probe head having a substrate disposed therein with probe circuitry formed on the substrate;
    an insulating plug disposed in one end of the probe head having a bore there through for receiving a low capacitance probe tip with the probe tip being electrically coupled to the substrate;
    the insulating plug having a recess defining a socket with the socket having an aperture formed therein to access the low capacitance probe tip;
    an electrically conductive contact disposed in the aperture in electrical contact with the low capacitance probe tip and extending into the socket.

12. The measurement probe as recited in claim 11 wherein the socket is formed parallel to the low capacitance probe tip.

13. The measurement probe as recited in claim 12 wherein the electrically conductive contact further comprises a spring contact formed on the probe tip and extending through the aperture into the socket.

14. The measurement probe as recited in claim 13 wherein the spring contact further comprises an electrically conductive wire affixed to the probe tip and having a fold therein that extends through the aperture into the socket.

15. The measurement probe as recited in claim 13 wherein the electrically conductive wire is formed of beryllium-copper.

16. The measurement probe as recited in claim 11 wherein the socket is formed at an angle to the low capacitance probe tip.

17. The measurement probe as recited in claim 16 wherein the distal end of the socket intersects the low capacitance probe tip and the electrically conductive contact further comprises an electrically conductive elastomeric material disposed at the distal end of the socket in electrical contact with the low capacitance probe tip.

* * * * *